United States Patent
Son et al.

(10) Patent No.: US 8,735,229 B2
(45) Date of Patent: May 27, 2014

(54) METHOD OF MANUFACTURING ZNO-BASED THIN FILM TRANSISTOR

(75) Inventors: Kyoung-seok Son, Seoul (KR);
Sang-yoon Lee, Seoul (KR);
Myung-kwan Ryu, Yongin-si (KR);
Tae-sang Kim, Seoul (KR); Jang-yeon Kwon, Seongnam-si (KR); Kyung-bae Park, Seoul (KR); Ji-sim Jung, Incheon (KR)

(73) Assignee: Samsung Electronics Co., Ltd. (KR)

( * ) Notice: Subject to any disclaimer, the term of this patent is extended or adjusted under 35 U.S.C. 154(b) by 350 days.

(21) Appl. No.: 12/110,744

(22) Filed: Apr. 28, 2008

(65) Prior Publication Data

US 2008/0299702 A1    Dec. 4, 2008

(30) Foreign Application Priority Data

May 28, 2007  (KR) .................. 10-2007-0051560

(51) Int. Cl.
*H01L 21/00*    (2006.01)

(52) U.S. Cl.
USPC ........................................ 438/149

(58) Field of Classification Search
USPC ................... 257/E29.273; 438/149
See application file for complete search history.

(56) References Cited

U.S. PATENT DOCUMENTS

| | | | | |
|---|---|---|---|---|
| 5,602,047 A * | 2/1997 | Tsai et al. | ..... | 438/160 |
| 5,741,740 A * | 4/1998 | Jang et al. | ..... | 438/435 |
| 5,976,959 A * | 11/1999 | Huang | ..... | 438/487 |
| 5,990,555 A * | 11/1999 | Ohori et al. | ..... | 257/750 |
| 6,013,558 A * | 1/2000 | Harvey et al. | ..... | 438/424 |
| 6,017,614 A * | 1/2000 | Tsai et al. | ..... | 428/209 |
| 6,673,126 B2 * | 1/2004 | Miyasaka | ..... | 29/25.01 |
| 2001/0044172 A1 * | 11/2001 | Chen et al. | ..... | 438/149 |
| 2006/0060857 A1 * | 3/2006 | Mardilovich et al. | ..... | 257/66 |
| 2007/0042536 A1 * | 2/2007 | Chen et al. | ..... | 438/149 |
| 2007/0072439 A1 * | 3/2007 | Akimoto et al. | ..... | 438/795 |

* cited by examiner

*Primary Examiner* — Yu-Hsi D Sun
(74) *Attorney, Agent, or Firm* — Cantor Colburn LLP

(57) ABSTRACT

A ZnO-based thin film transistor (TFT) is provided herein. Also provided is a method for manufacturing the TFT. The ZnO-based TFT is very sensitive to the oxygen concentration present in a channel layer. In order to prevent damage to a channel layer of a bottom gate TFT, and to avoid a deep negative threshold voltage resulting from damage to the channel layer, the method for manufacturing the ZnO-based TFT comprises formation of an etch stop layer or a passivation layer comprising unstable or incompletely bonded oxygen, and annealing the layers to induce an interfacial reaction between the oxide layer and the channel layer and to reduce the carrier concentration.

24 Claims, 16 Drawing Sheets

METHOD OF MANUFACTURING ZNO-BASED THIN FILM TRANSISTOR

This application claims priority to Korean Patent Application No. 10-2007-0051560, filed on May 28, 2007, and all the benefits accruing therefrom under 35 U.S.C. §119, the contents of which is incorporated herein in their entirety by reference.

BACKGROUND OF THE INVENTION

1. Field of the Invention

The present disclosure relates to an oxide semiconductor thin film and a method of manufacturing a thin film transistor (TFT) using the same, and more particularly, to a semiconductor thin film comprising ZnO and a method of manufacturing a TFT using the same.

2. Description of the Related Art

Thin film transistors (TFTs) using a semiconductor thin film are applied in various fields, and are often used as active devices for flat panel displays. Specifically, oxide semiconductor films, particularly, semiconductor films comprising ZnO, for example an amorphous gallium-indium-zinc-oxide (GIZO) semiconductor film, can be processed at low temperatures and can be easily made on a large scale. Also, since the semiconductor film comprising ZnO has a high mobility, the ZnO-based semiconductor film has good electrical properties like a polycrystalline silicon film.

However, carrier concentration in the ZnO-based semiconductor film is sensitive to changes in oxygen concentration, and the physical and electrical properties of the ZnO-based semiconductor film are greatly affected by both thermal and chemical treatments. When a TFT comprising a ZnO-based semiconductor film is manufactured, the ZnO-based semiconductor film is exposed to high-energy plasma and is thus subject to plasma-induced damage and thermal damage, thereby increasing the carrier concentration. The abnormal increase in the carrier concentration shifts the threshold voltage of the ZnO-based TFT to a larger negative voltage, such that a large leakage current flows between a source electrode and a drain electrode even when the gate voltage is 0 V. The leakage current is a critical problem in cases where the ZnO-based TFT is a back channel etch (BCE) TFT in which a SiNx passivation layer is formed on both the source and the drain electrodes, and where the ZnO-based TFT is an etch stopper TFT in which a channel layer is protected by an etch stopper and both the source and the drain electrodes are formed by etching.

In short, the damage to the channel layer resulting in the shifting of the threshold voltage, is related to an increase in the carrier concentration in the channel layer. Accordingly, there is a demand for a method of manufacturing a ZnO-based TFT having good electrical properties by controlling the carrier concentration.

BRIEF SUMMARY OF THE INVENTION

The present disclosure provides a method of manufacturing a thin film transistor (TFT) comprising ZnO having good electrical properties by controlling the carrier concentration in a channel layer.

According to one embodiment, there is provided a method of manufacturing a thin film transistor (TFT), the method comprising: forming a channel layer comprising ZnO on a substrate; forming an oxide layer comprising unstable or incompletely bonded oxygen on the channel layer; and annealing the channel layer and the oxide layer, wherein the annealing of the channel layer and the oxide layer allows oxygen of the oxide layer to be introduced to the channel layer, thereby inducing an interfacial reaction between the channel layer and the oxide layer and reducing carrier concentration in the channel layer.

According to another embodiment, there is provided a method of manufacturing a TFT, the method comprising: forming a channel layer comprising ZnO on a substrate; forming a conductive material layer on the channel layer; patterning the conductive material layer to form a source electrode and a drain electrode contacting both sides of the channel layer; forming an oxide passivation layer comprising unstable or incompletely bonded oxygen on the channel layer, the source electrode, and the drain electrode; and annealing the channel layer and the passivation layer to introduce oxygen of the passivation layer to the channel layer, thereby inducing an interfacial reaction between the channel layer and the passivation layer, and reducing carrier concentration in the channel layer.

According to another embodiment, there is provided a method of manufacturing a TFT, the method comprising: forming a channel layer comprising ZnO on a substrate; forming an oxide material layer containing unstable or incompletely bonded oxygen on the channel layer; patterning the oxide material layer to form an etch stop layer covering a middle portion of the channel layer and exposing both sides of the channel layer; forming a conductive material layer on the channel layer and the etch stop layer; patterning the conductive material layer to form a source electrode and a drain electrode contacting both the sides of the channel layer; forming a passivation layer covering the source electrode, the drain electrode, and a portion of the etch stop layer between the source electrode and the drain electrode; and annealing the channel layer and the oxide material layer to introduce oxygen of the etch stop layer to the channel layer, thereby inducing an interfacial reaction between the channel layer and the etch stop layer, and reducing carrier concentration in the channel layer.

In one embodiment, the etch stop layer and the passivation layer may be an oxide layer containing unstable oxygen having bonding energy less than the bonding energy between oxygen and the cation of the channel layer. The oxide layer may be formed of a silicon oxide (SiOx) layer comprising incomplete oxygen.

In another embodiment, the oxide layer, such as the etch stop layer and the passivation layer, is a non-rigid oxide layer, and may be formed by plasma enhanced chemical vapor deposition (PECVD) performed at a low temperature of about room temperature to about 250° C. wherein the source gas comprises $N_2O$ to increase the oxygen concentration in the oxide layer.

In one embodiment, the channel layer may be a layer comprising: $a(In_2O_3) \cdot b(Ga_2O_3) \cdot c(ZnO)$, wherein $a \geq 0$, $b \geq 0$, and $c \geq 0$.

In another embodiment, the channel layer may be a layer comprising $a(In_2O_3) \cdot b(Ga_2O_3) \cdot c(ZnO)$, wherein $a \geq 1$, $b \geq 1$, and $0 < c \leq 1$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1A:
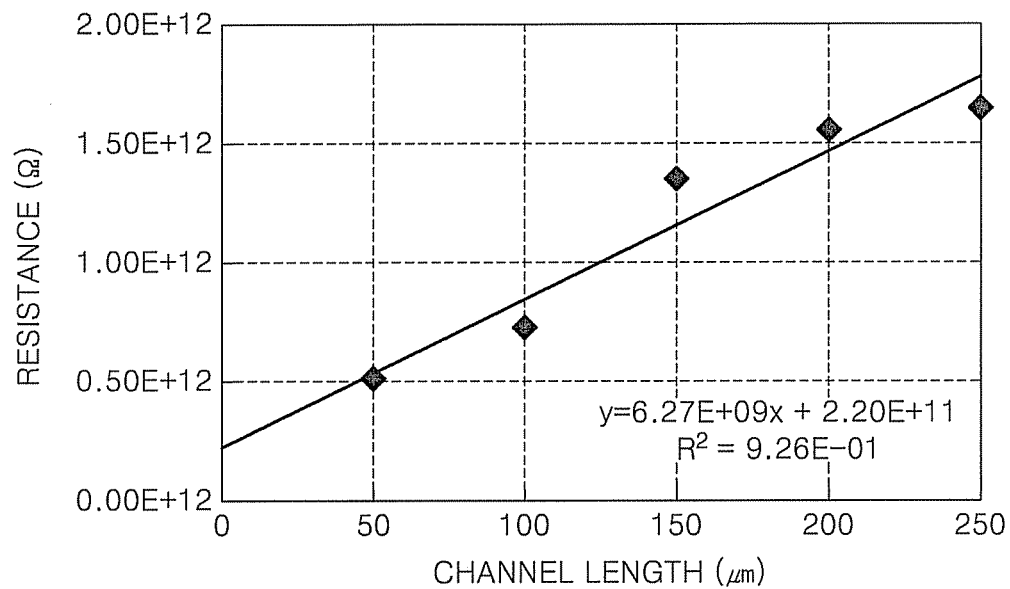
FIGS. 1A and 1B are graphs illustrating the electrical properties of a patterned semiconductor channel layer comprising ZnO, before and after annealing, respectively.
Figure 1B:
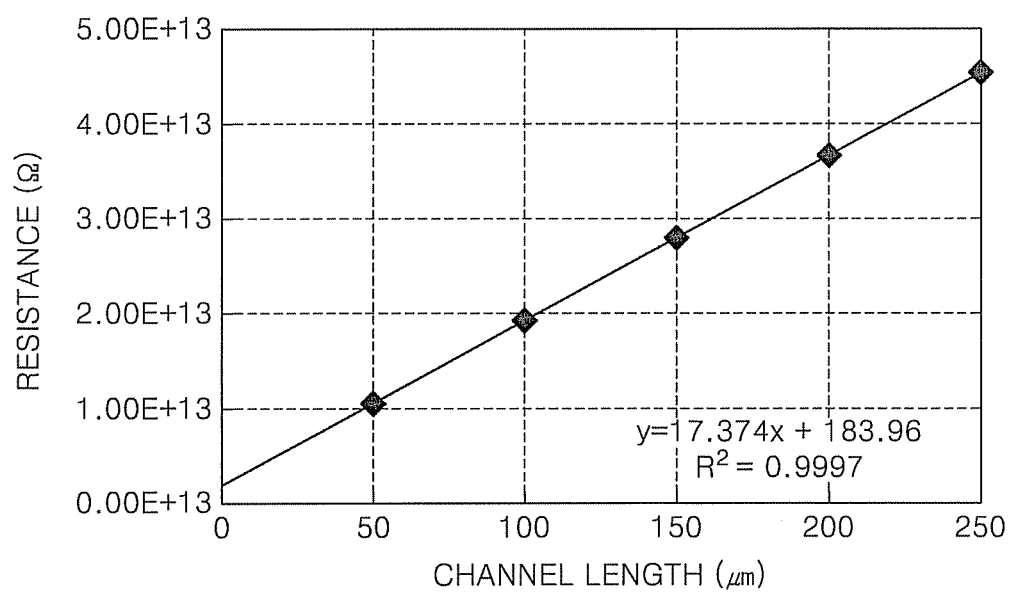

FIGS. 1A and 1B are graphs illustrating the electrical properties of a patterned ZnO-based semiconductor channel layer, specifically, a gallium-indium-zinc-oxide (GIZO) channel layer, before and after annealing.

Referring to FIG. 1A, the GIZO channel layer, before annealing, has a conductivity of $1.47 \times 10^{-8}$ (Siemens per centimeter) (S/cm). Referring to FIG. 1B, the GIZO channel layer, after annealing, is thermally unstable and has a conductivity of $1.71 \times 10^0$ S/cm.

The thermal instability and increase in electrical conductivity after annealing, results from the collision of high-energy plasma ions released when the source and the drain electrodes are formed by patterning, and from a subsequent increase in carrier concentration in the channel layer. The increase in the carrier concentration causes the thin film transistor (TFT) to have a large negative threshold voltage.

In order to prevent the large threshold voltage, the carrier concentration in the channel layer should be reduced (deoxidized) by increasing the amount of oxygen, and by preventing the channel layer from being reduced during the annealing. Accordingly, in one embodiment, a TFT comprising ZnO contains a sufficient amount of oxygen in a passivation layer, or in an etch stop layer contacting a channel layer, and is capable of suppressing hydrogen which is a reducing agent. In contrast, when the passivation layer or the etch stop layer is formed of silicon nitride (SiN), a material that is widely used to form a passivation layer or an etch stop layer, then $SiH_4$, $NH_3$, or $N_2$ is used as source gas. However, $SiH_4$, $NH_3$, or $N_2$ do not contain oxygen. Also, the SiN layer contains a large amount of hydrogen attributable to $SiH_4$ or $NH_3$. Consequently, a reduction reaction occurs between the hydrogen contained in the SiN layer and a surface of the channel layer, thereby producing a significant number of carriers. As a result, the increased number of carriers causes current to flow between the source and the drain electrodes even when the gate voltage is 0 Volts (V).

Figure 2A:
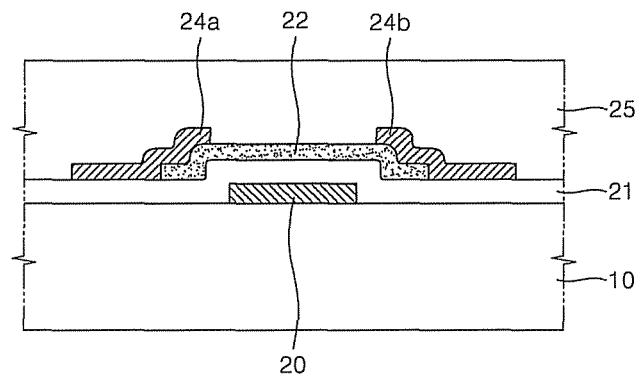
FIG. 2A is a cross-sectional view of an exemplary bottom gate thin film transistor (TFT)

In one embodiment, a bottom gate back channel etch (BCE) TFT, in which a surface of the channel layer is etched while the source and the drain electrodes are formed by patterning, is provided as illustrated in the cross-sectional view of FIG. 2A. In another embodiment, a bottom gate TFT, in which a surface of the channel layer is protected by an etch stop layer (or a protective layer), is provided as illustrated in the cross-sectional view of FIG. 2B.

Referring to FIG. 2A, a gate 20 is formed on a substrate 10, and a gate insulating layer 21 covering the gate 20 is formed on the substrate 10. A channel layer 22 corresponding to the gate 20 is formed on the gate insulating layer 21. The substrate 10 is formed of a transparent material or an opaque material such as silicon, glass, plastic, or other suitable material. The channel layer 22 may be a ZnO-based semiconductor layer, for example, a gallium-indium-zinc-oxide (GIZO) layer. Specifically, the GIZO layer may be comprised of the layer $a(In_2O_3).b(Ga_2O_3).c(ZnO)$, wherein $a \geq 0$, $b \geq 0$, and $c > 0$. More specifically, the GIZO layer may be comprised of the layer $a(In_2O_3).b(Ga_2O_3).c(ZnO)$ wherein $a \geq 1$, $b \geq 1$, and $0 < c \leq 1$. The GIZO channel layer 22 may be formed by physical vapor deposition (PVD) methods comprising sputtering and evaporation.

A source electrode 24a and a drain electrode 24b are formed on both sides of the channel layer 22 and extend to portions of the substrate 10 not covered by the channel layer 22. Each of the source electrode 24a and the drain electrode 24b may be a metal layer. Examples of the metal layer include selected a molybdenum (Mo) single metal layer; a multi-metal layer comprising a Mo layer; a metal layer comprising titanium (Ti); a metal layer comprising chromium (Cr); or a combination comprising at least one of the foregoing metal layers.

A thick passivation layer 25 is formed on the channel layer 22, the source electrode 24a, and the drain electrode 24b. The passivation layer 25 may be formed of an oxygen-rich oxide material, such as for example, silicon oxide (SiOx). That is, the passivation layer 25 contains a significant amount of oxygen that is incompletely or unstably bonded with silicon, resulting in an oxygen content that is greater than an oxygen content of the same oxide material which is not oxygen-rich. The passivation layer 25 is formed by low temperature plasma enhanced chemical vapor deposition (PEVCD) methods. Since high temperature PECVD results in the formation of a rigid layer, it is difficult to completely contain incomplete or free oxygen in the passivation layer 25 during high temperature PECVD.

The channel layer 22, the source electrode 24a, the drain electrode 24b, the gate insulting layer 21, and the gate 20 may have thicknesses of about 30 to about 200 nanometers (nm), about 10- to about 200 nm, about 10 to about 200 nm, about 100 to about 300 nm, and about 100 to about 300 nm, respectively.

Although not shown, an ohmic contact layer may be disposed between the channel layer 22 and the source electrode 24a and between the channel layer 22 and the drain electrode 24b. The ohmic contact layer may be a conductive oxide layer having oxygen content less than that of the channel layer 22. The ohmic contact layer reduces contact resistance between the channel layer 22 and the source electrode 24a, and between the channel layer 22 and the drain electrode 24b, and prevents holes from escaping from the channel layer 22.

Figure 2B:
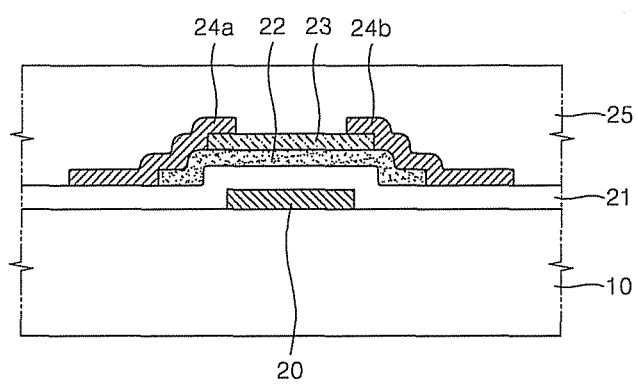
FIG. 2B is a cross-sectional view of another exemplary bottom gate TFT.

Referring to FIG. 2B, in addition to the structure of FIG. 2A, a protective layer or an etch stop layer 23 is formed between the channel layer 22 and the passivation layer 25. The etch stop layer 23 may be formed of an oxide material containing a significant amount of oxygen, such as for example, SiOx. The etch stop layer 23 may be formed of the same material as that of the passivation layer 25, and a passivation layer 25 on the etch stop layer 23 may be formed of SiN or $SiO_2$.

In one embodiment, a method of manufacturing a bottom gate TFT is provided in which a gate is formed under a channel layer. According to the present embodiment, conductivity is effectively controlled during the annealing of the channel layer that has been damaged by heat and plasma in the manufacturing method, thereby enabling the bottom gate TFT to have good electrical properties. To this end, the carrier concentration is reduced in the channel layer during annealing by increasing the amount of oxygen, which is an oxidizing agent, and decreasing the amount of hydrogen, which is a reducing agent. The passivation layer or the etch stop layer contacting the channel layer introduces oxygen to the channel layer. The passivation layer and the etch stop layer may be formed of SiOx containing a significant amount of incomplete or unstable oxygen.

Figure 3A:
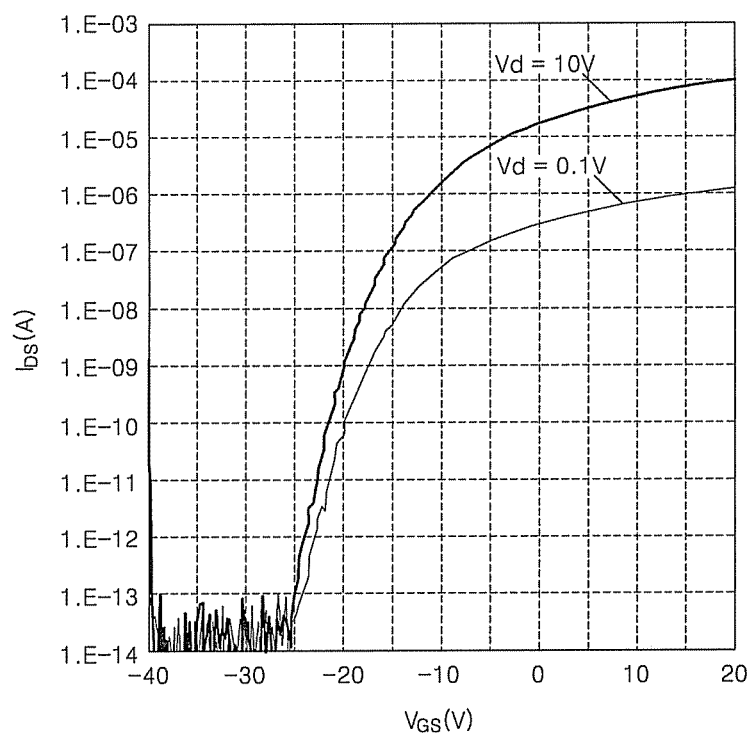
FIG. 3A is a graph illustrating the relationship between the gate voltage and the source-drain current of a back channel etch (BCE) TFT having a channel layer that is annealed without a passivation layer.
Figure 3B:
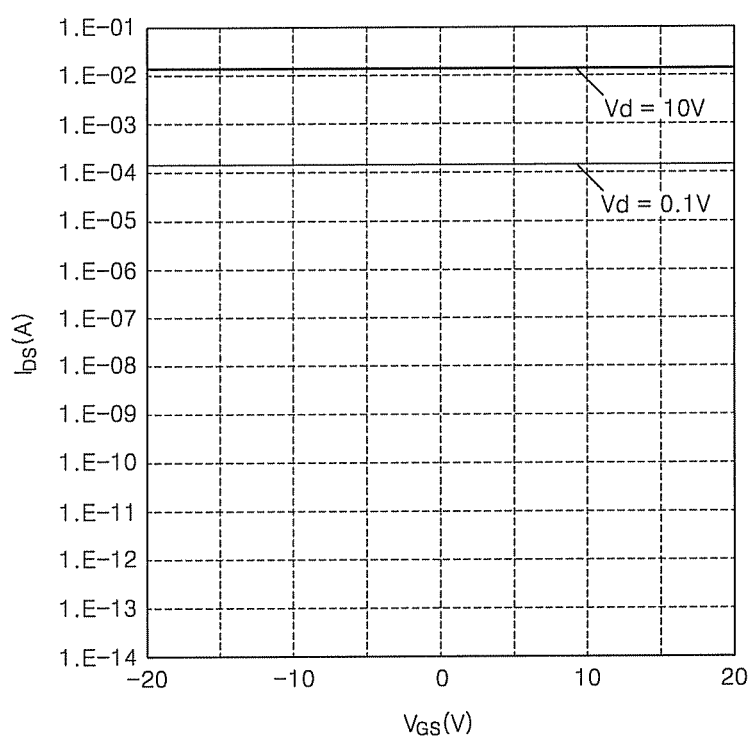
FIG. 3B is a graph illustrating the relationship between the gate voltage and the source-drain current of a TFT that is annealed when a silicon nitride (SiN) passivation layer is formed on a channel layer.
Figure 3C:
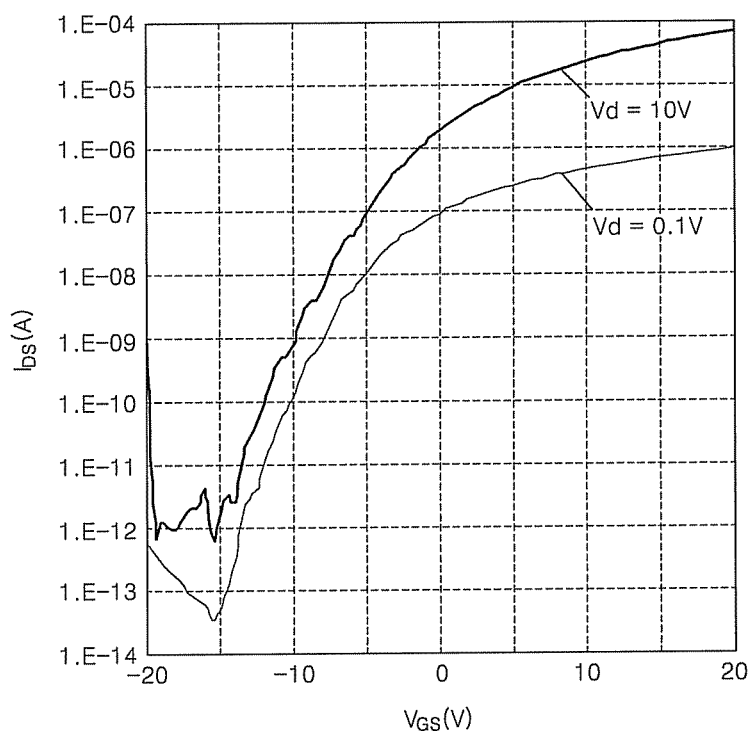
FIG. 3C is another graph illustrating the relationship between the gate voltage and the source-drain current of a TFT that is annealed when a silicon oxide (SiOx) passivation layer is formed on a channel layer.

FIGS. 3A through 3C are graphs illustrating the electrical properties of BCE TFT samples. FIG. 3A is a graph illustrating the relationship between the gate voltage and the source-drain current of a BCE TFT having a channel layer that is annealed without a passivation layer. FIG. 3B is a graph illustrating the relationship between the gate voltage and the source-drain current of a TFT which is annealed when a SiN passivation layer is formed on a channel layer. FIG. 3C is a graph illustrating the relationship between the gate voltage and the source-drain current of a TFT that is annealed when a SiOx passivation layer is formed on a channel layer. In FIGS. 3A through 3C, Vd denotes the source-drain voltage applied to the channel layer.

Referring to FIG. 3A, the threshold voltage is a low negative voltage and the source-drain current is relatively linear at gate voltages of about −25 V to about −15 V. Referring to FIG. 3B, since the TFT comprises the SiN passivation layer, the threshold voltage is a very deep negative voltage, and the source-drain current is constant when the gate voltage is changed. Referring to FIG. 3C, since the TFT comprises the SiOx passivation layer, and a sufficient amount of oxygen is directed to the channel layer during the annealing, normal operation of the TFT is ensured and a threshold voltage is shifted to a more positive value when compared with the TFT of FIG. 3A.

It is found that introducing a significant amount of oxygen to the channel layer during the annealing can reduce the carrier concentration so as to manufacture a TFT having desired properties. As is shown in FIG. 3B, the SiN passivation layer induces a reduction reaction in the channel layer, thereby increasing the carrier concentration. $SiH_4$, $NH_3$, or $N_2$, which can be used as a source gas to form the SiN layer, do not contain oxygen. Accordingly, a significant amount of hydrogen, which is a reducing agent, is contained in the SiN layer, and thus the carrier concentration is increased due to the reduction of the channel layer.

An oxide layer for supplying oxygen to a channel layer may be formed by PECVD methods. Low temperature PECVD can form a relatively non-rigid oxide layer. That is, incomplete or unstable oxygen can be contained in the oxide layer formed on a substrate using the low temperature process. In one embodiment, $N_2O$ is used as source gas, and the oxygen content of the oxide layer can be tailored by controlling the $N_2O$ gas flow rate, the plasma power, which determines ion collision energy, the pressure, and the distance between electrodes, thereby controlling the threshold voltage of the TFT. As the pressure increases, the ion collision energy decreases, the deposition rate decreases, and thus carrier production resulting from plasma damage to a surface of the channel layer can be suppressed.

Figure 4A:
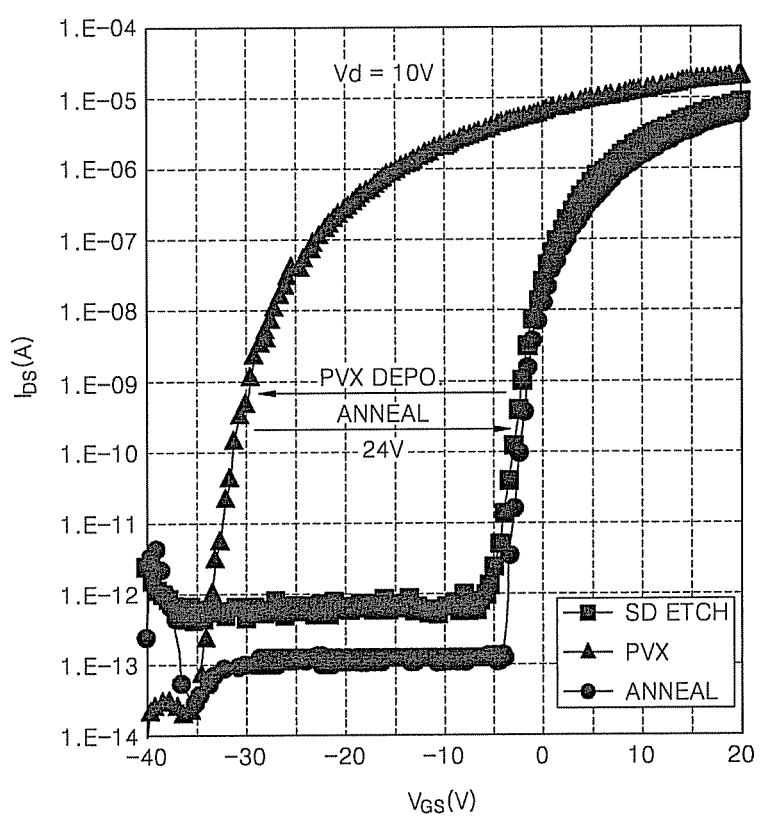
FIG. 4A is a graph illustrating the relationship between the gate voltage and the source-drain current for each of: a channel layer which is annealed without a passivation layer after source and drain electrodes are formed by patterning; a channel layer which is not annealed after source and drain electrodes are formed by patterning and a passivation layer is formed; and a channel layer which is annealed after source and drain electrodes are formed by patterning and a passivation layer is formed.

FIG. 4A is a graph illustrating the relationship between the gate voltage and the source-drain current for each of a channel layer "SD Etch" which is annealed without a passivation layer after the source and the drain electrodes are formed by patterning; a channel layer "PVX" which is not annealed after the source and the drain electrodes are formed by patterning and the passivation layer is formed; and a channel layer "Anneal" which is annealed after the source and the drain electrodes are formed by patterning and the passivation layer is formed.

Referring to FIG. 4A, the channel layer SD Etch which is annealed without a passivation layer, shows a relatively good threshold voltage. In the case of a channel layer annealed after the source and the drain electrodes are formed and after the passivation layer is formed (Anneal), the threshold voltage is shifted to a more negative value. When the channel layer is annealed, a desired threshold voltage is obtained. When the passivation layer is formed and then the channel layer is annealed, the negative threshold voltage is shifted about 24 V to a less negative value. It is found that when a passivation layer is formed on a channel layer, the carrier concentration is increased in a region near the surface of a channel layer damaged during the forming of the source and the drain electrodes by patterning, and that the increased carrier concentration in the channel layer is subsequently reduced due to the oxygen supplied from the passivation layer during the annealing.

Figure 4B:
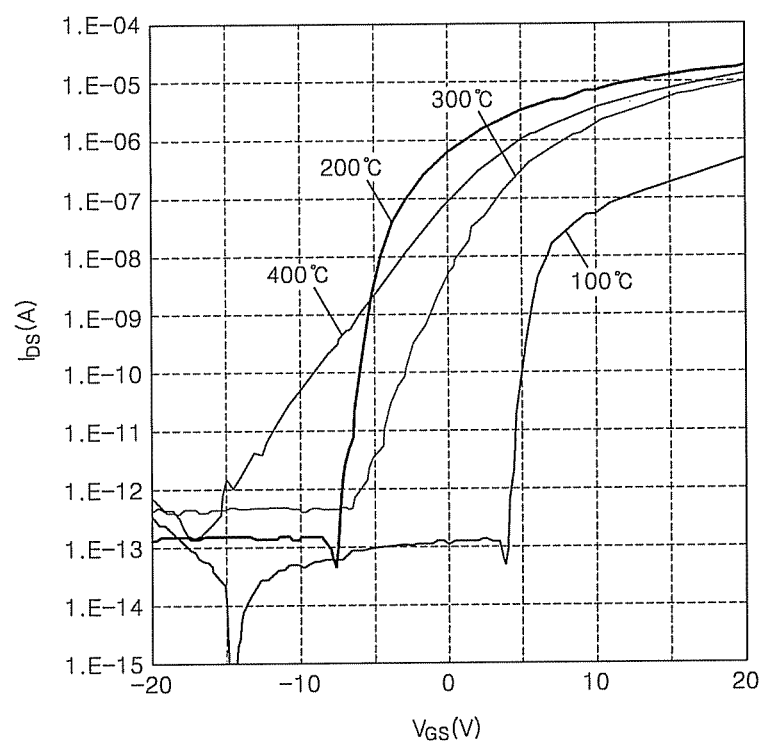
FIG. 4B is a graph illustrating the relationship between the gate voltage and the source-drain current for each of the channel layers which are annealed at temperatures of 100, 200, 300, or 400° C.

FIG. 4B is a graph illustrating the effect of annealing temperature on the electrical properties of a channel layer. When annealing is performed at a temperature of about 400° C., the sub-threshold current is increased and the contact resistance may be increased by the oxidation of the source and the drain electrodes. When annealing is performed at a temperature of about 300° C., the sub-threshold current is increased. When annealing is performed at a temperature of about 100° C., the damage repair is not satisfactory and electron mobility is subsequently reduced. When annealing is performed at a temperature of about 200° C., the desired electrical properties are obtained.

Figure 5A:
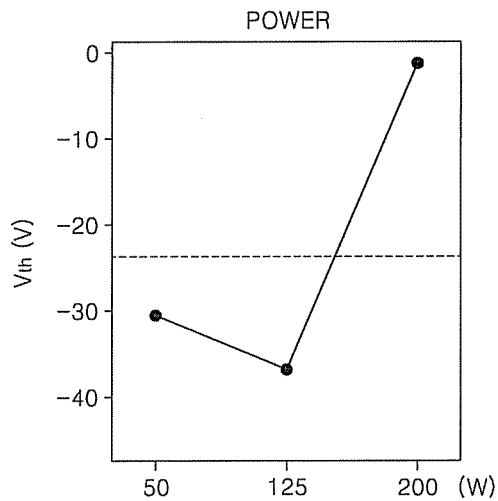
FIGS. 5A, 5B, and 5C are graphs respectively illustrating the relationship between the threshold voltage and the power; between the threshold voltage and the pressure; and between the threshold voltage and the flow rate when a passivation layer is formed by plasma enhanced chemical vapor deposition (PECVD)
Figure 5B:
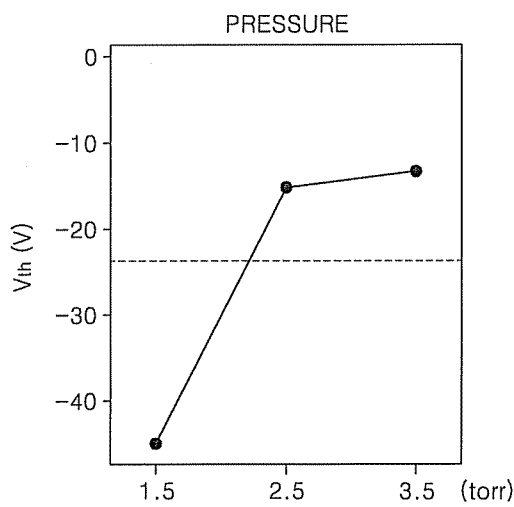
Figure 5C:
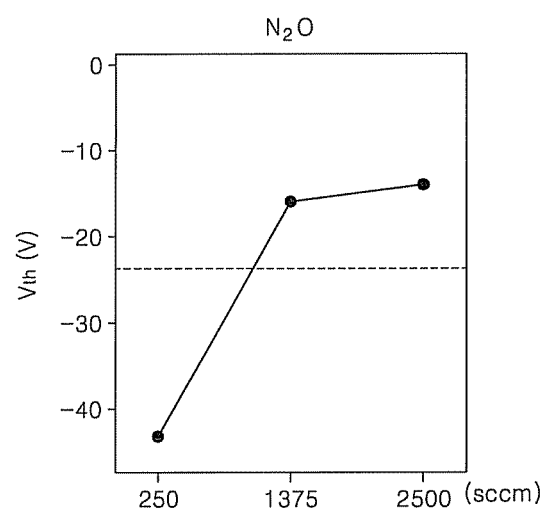

FIGS. 5A, 5B, and 5C are graphs respectively illustrating the relationship between the threshold voltage and the power, between the threshold voltage and the pressure, and between the threshold voltage and the flow rate, when the passivation layer is formed by PECVD.

FIG. 5A is a graph illustrating the threshold voltages observed when the plasma power is 50, 125, or 200 W. Referring to FIG. 5A, when the plasma power is 200 W, the threshold voltage is close to 0 V. When the plasma power is 50 W, the threshold voltage is close to −30 V, and when the plasma power is 125 W the threshold voltage is deeper than that obtained when the plasma power is 50 W.

FIG. 5B is a graph illustrating the relationship between the threshold voltage and the pressure. As shown in FIG. 5B, as the pressure increases, the threshold voltage is shifted to a less negative value.

FIG. 5C is a graph illustrating the relationship between the threshold voltage and the flow rate of the $N_2O$ source gas. As shown in FIG. 5C, as the gas flow rate increases, the threshold voltage is shifted to a less negative voltage.

Figure 6A:
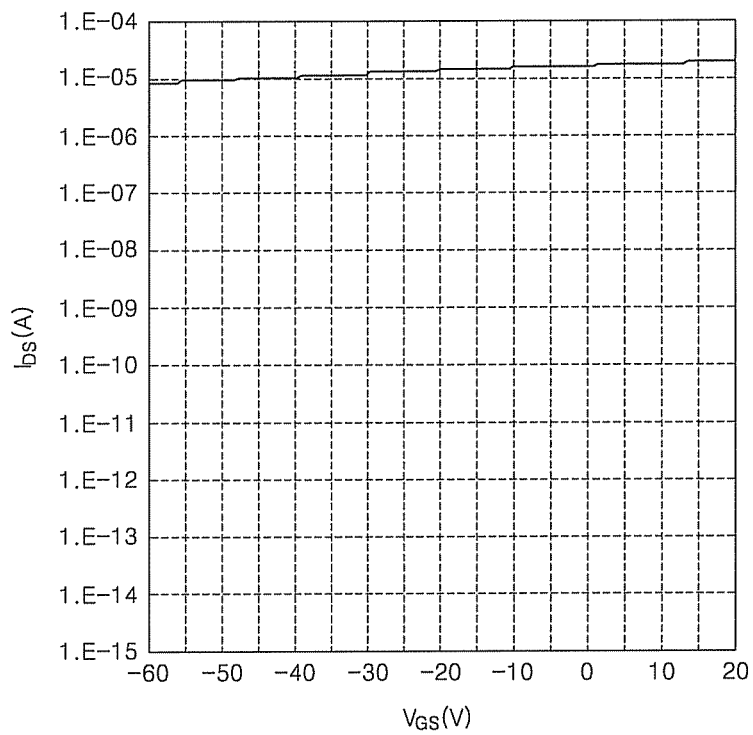
FIG. 6A is a graph illustrating the relationship between the gate voltage and the source-drain current when the etch stopper layer of the TFT of FIG. 2B is formed of SiN.
Figure 6B:
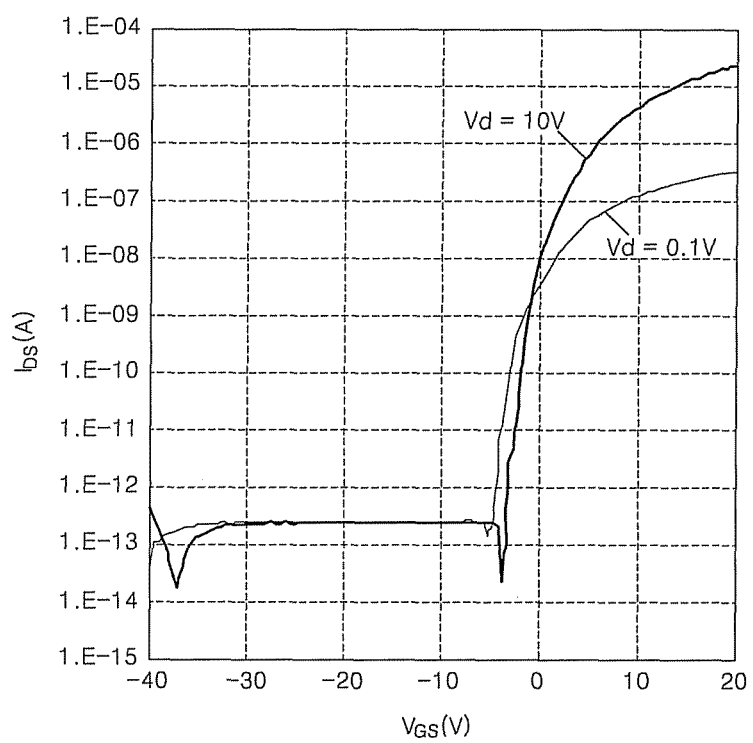
FIG. 6B is a graph illustrating the relationship between the gate voltage and the source-drain current when the etch stopper of the TFT of FIG. 2B is formed of SiOx.

FIG. 6A is a graph illustrating the relationship between the gate voltage and the source-drain current when the etch stopper layer of the exemplary TFT of FIG. 2B is formed of SiN. FIG. 6B is a graph illustrating the relationship between the gate voltage and the source-drain current when the etch stopper of the exemplary TFT of FIG. 2B is formed of SiOx. Referring to FIGS. 6A and 6B, the exemplary TFT of FIG. 6B demonstrates the desired source-drain current, and has a turn-on voltage of about −5 V.

Figure 7A:
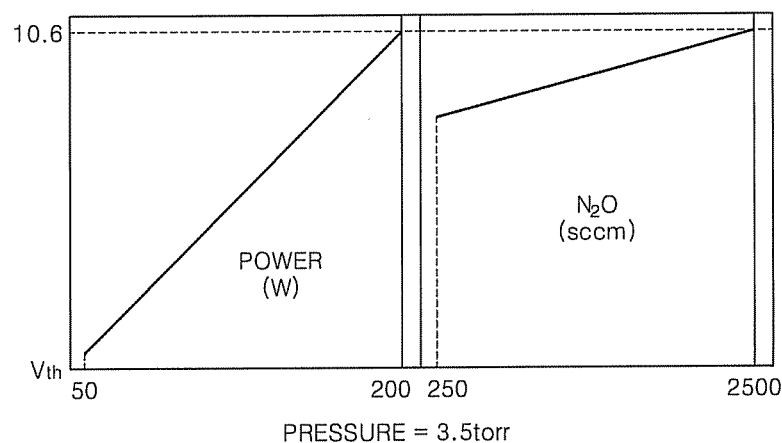
FIG. 7A is a graph illustrating the relationship between the threshold voltage and the power, and between the threshold voltage and the $N_2O$ flow rate, when the pressure is fixed at 3.5 Torr.
Figure 7B:
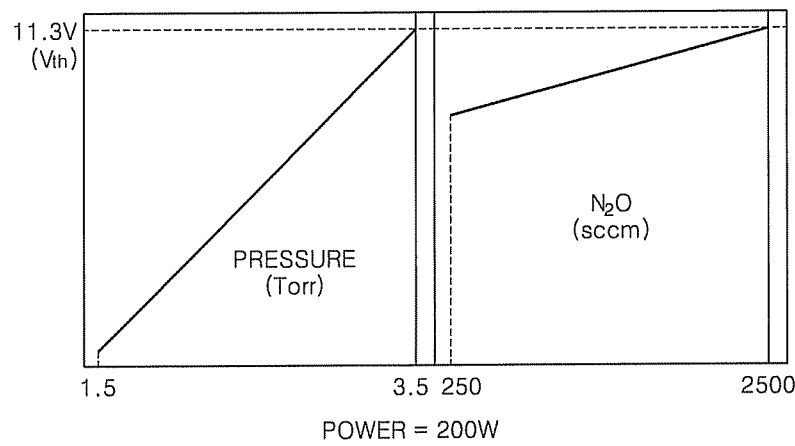
FIG. 7B is a graph illustrating the relationship between the threshold voltage and the pressure, and between the threshold voltage and the $N_2O$ flow rate, when the power is fixed at 200 Watts (W)

FIGS. 7A and 7B are graphs illustrating optimal process conditions.

FIG. 7A is a graph illustrating the relationship between the threshold voltage and the plasma power, and between the threshold voltage and the $N_2O$ flow rate when a chamber pressure is fixed to about 3.5 Torr. Referring to FIG. 7A, as the plasma power increases and as the gas flow rate increases, the threshold voltage also increases. The threshold voltage of +10.6 V is obtained when the pressure is 3.5 Torr, the power is 200 W, and the $N_2O$ flow rate is 2500 sccm.

FIG. 7B is a graph illustrating the relationship between the threshold voltage and the pressure, and between the threshold voltage and the $N_2O$ flow rate when the plasma power is fixed to 200 W. As the pressure increases and as the gas flow rate increases, the threshold voltage also increases. The threshold voltage of +11.3 V is obtained when the pressure is 3.5 Torr, the power is 200 W, and the $N_2O$ flow rate is 2500 sccm.

In another embodiment, a method of manufacturing a TFT comprising ZnO is provided.

In one embodiment, a method of manufacturing a BCE TFT is provided as illustrated in the cross-sectional views of FIGS. 8A through 8E. The reference numerals in FIGS. 2A and 8A through 8E denote the same elements.

Figure 8A:
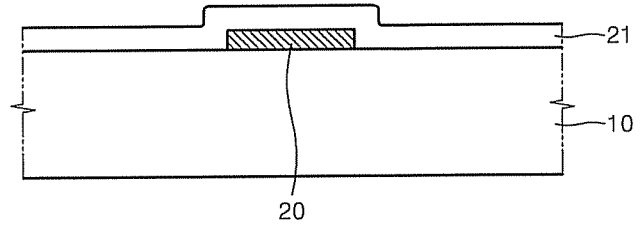
FIG. 8A through 8E are cross-sectional views illustrating an exemplary method of manufacturing a TFT.

Referring to FIG. 8A, a gate 20 is formed on a substrate 10, and a gate insulating layer 21 covering the gate 20 is formed on the substrate 10. Next, wet cleaning may be performed to remove impurities existing on a top surface of the gate insulating layer 21. A cleaning solution used in the wet cleaning may comprise at least one selected from isopropyl alcohol (IPA), deionized water, and acetone.

Figure 8B:
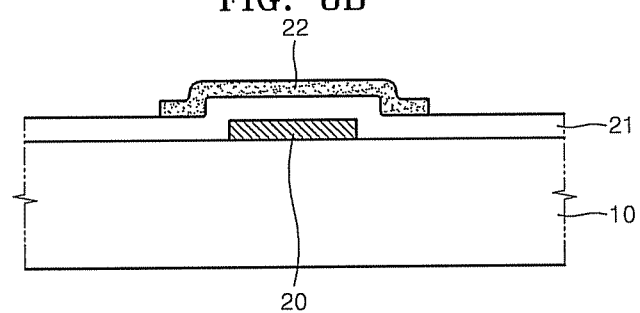

Referring to FIG. 8B, a channel layer 22 corresponding to the gate 20 is formed on the gate insulating layer 21 such that the channel layer 22 is disposed on the gate insulating layer 21 and over the gate 20. The channel layer 22 may be formed by PVD methods including sputtering, evaporation, and other suitable methods. The channel layer 22 may be formed by sputtering a target selected from the group consisting of $In_2O_3$, $Ga_2O_3$, ZnO, and a combination comprising at least one of the foregoing targets. Next, a surface of the channel layer 22 may be subjected to oxygen plasma treatment to increase the oxygen concentration in a region near the surface of the channel layer 22, and to increase the electrical resistance in the region near the surface of the channel layer 22, thereby reducing degradation of the region near the surface of the channel layer 22. Next, wet cleaning may be performed to remove etching byproducts existing on the top surface of the channel layer 22 and the substrate 10. A cleaning solution used in the wet cleaning may comprise any one of IPA, deionized water, and acetone.

Figure 8C:
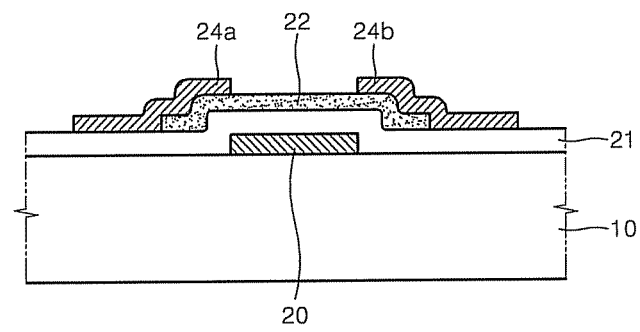

Referring to FIG. 8C, a source electrode 24a and a drain electrode 24b contacting both sides of the channel layer 22 are formed on the gate insulating layer 21.

The forming of the source electrode 24a and the drain electrode 24b comprises forming a metal layer covering the channel layer 22 on the substrate 10, and forming a mask defining the source and the drain regions on the metal layer. The metal layer is etched using the mask by either wet or dry etching methods.

Examples the metal layer include a Mo single metal layer, a multi-metal layer comprising a Mo layer, a metal layer comprising Ti, a metal layer comprising Cr, and a combination comprising at least one of the foregoing metal layers. The metal layer may be formed by PVD. The metal layer may be wet etched using a mixture of phosphoric acid ($H_3PO_4$), acetic acid ($CH_3COOH$), nitric acid ($HNO_3$), and deionized water as an etching solution. The metal layer may be dry etched by plasma etching (PE) or reactive ion etching (RIE) methods.

If the source electrode 24a and the drain electrode 24b are formed at a high temperature, an ohmic contact layer (not shown) having an oxygen content less than that of the channel layer 22, may be formed between the channel layer 22 and the source electrode 24a, and between the channel layer 22 and the drain electrode 24b. If the ohmic contact layer is not formed during the forming of the source electrode 24a and the drain electrode 24b, annealing may be performed after the source electrode 24a and the drain electrode 24b are formed. A reaction between the channel layer 22 and the source electrode 24a, and between the channel layer 22 and the drain layer 24b, occurs as a result of the annealing, thereby forming the ohmic contact layer.

Figure 8D:
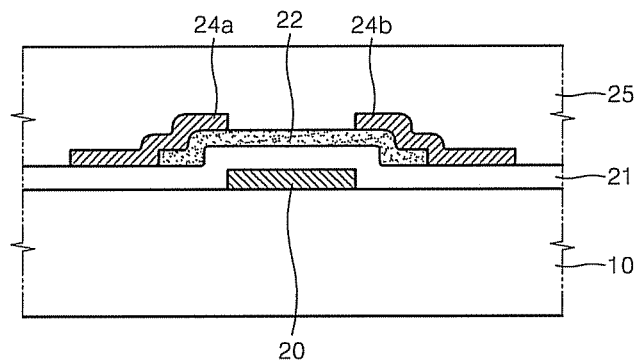

Referring to FIG. 8D, a passivation layer 25 covering the channel layer 22, the source electrode 24a, and the drain electrode 24b is formed on the gate insulating layer 21. The passivation layer 25 is formed by low temperature PECVD that easily allows for control of the concentration of incomplete oxygen in the passivation layer. The PECVD may be performed at a power of about 0.1 to about 4 $W/cm^2$, specifically at a power of about 0.9 $W/cm^2$; at a pressure of about 1.0 to about 4.0 Torr, specifically, at a pressure of about 3.5 Torr; at a $N_2O$ flow rate of about 1000 to about 7000 sccm, specifically, at a flow rate of about 2500 sccm, when $N_2O$ is added to silicon as source gas. The PECVD is performed at a temperature of about room temperature to about 250° C., specifically, at a temperature of about 150° C.

Figure 8E:
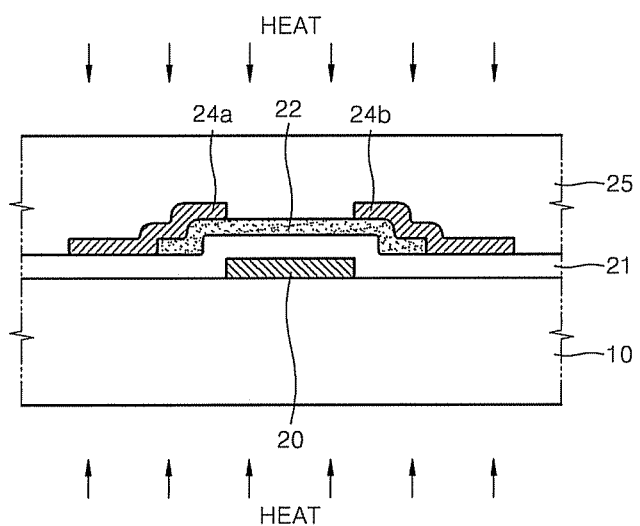

Referring to FIG. 8E, the channel layer 22 and the passivation layer 25 are subjected to annealing. The annealing process may be conducted using furnace annealing or rapid thermal annealing (RTA), and may be performed for about 10 minutes to about 2 hours at a temperature of about 200 to about 400° C., in either an oxygen or a nitrogen atmosphere.

Specifically, the annealing may be performed for about 1 hour at a temperature of about 200° C. Due to the annealing, the carrier concentration in the channel layer 22 is reduced, thereby obtaining a TFT having the desired electrical properties and the desired threshold voltage.

In one embodiment, a method of manufacturing a TFT is provided, in which an etch stop layer is formed as a protective layer on a surface of a channel layer, as illustrated in FIGS. 9A through 9E. The reference numerals in FIGS. 2B, and 9A through 9E, denote the same elements.

Figure 9A:
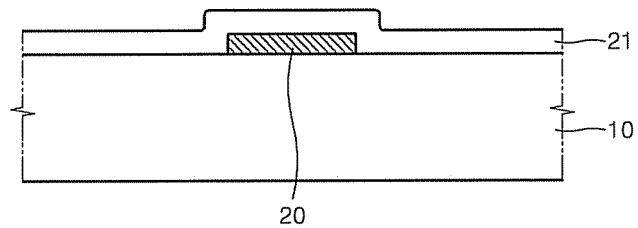
FIGS. 9A through 9E are cross-sectional views illustrating additional exemplary methods of manufacturing a TFT.

Referring to FIG. 9A, a gate 20 is formed on a substrate 10, and a gate insulating layer 21 covering the gate 20 is formed on the substrate 10. Next, a wet cleaning solution may be used to remove impurities existing on a top surface of the gate insulating layer 21.

Figure 9B:
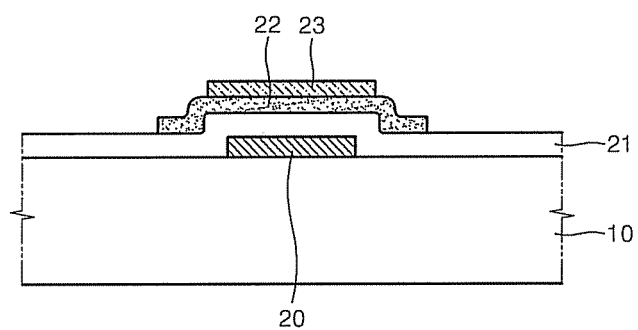

Referring to FIG. 9B, a channel layer 22 and a protective layer 23 are sequentially stacked on the gate insulating layer 21 such that the channel layer 22 is disposed on the gate insulating layer 21 and over the gate electrode 21. The channel layer 22 may be formed by PVD methods comprising sputtering and evaporation as described previously. The channel layer 22 may be formed by sputtering a target, examples of the target include $In_2O_3$, $Ga_2O_3$, ZnO, and a combination comprising at least one of the foregoing targets. Next, a surface of the channel layer 22 may be subjected to oxygen plasma treatment. Next, wet cleaning may be performed to remove etching byproducts existing on the top surface of the channel layer 22 and the substrate 10.

The protective layer 23 is formed by low temperature PECVD and then patterned in a general way. The protective layer 23 is formed by low temperature PECVD which allows for control of the incomplete oxygen content in the protective layer 23. The PECVD may be performed at a power of about 0.1 to 4 $W/cm^2$, specifically, at a power of about 0.9 $W/cm^2$; a pressure of about 1.0 to about 4.0 Torr, specifically, at a pressure of about 3.5 Torr; a $N_2O$ flow rate of about 1000 to about 7000 sccm, specifically, at a flow rate of about 2500 sccm, when $N_2O$ is added to silicon as source gas. The PECVD may be performed at a temperature of about room temperature to about 250° C., preferably, about 150° C.

Figure 9C:
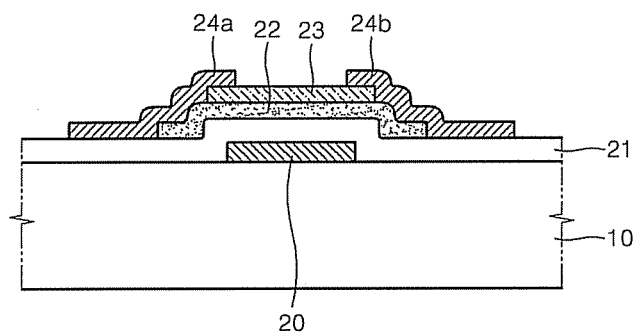

Referring to FIG. 9C, a source electrode 24a and a drain electrode 24b contacting both sides of the channel layer 22 are formed on the gate insulating layer 21 and the protective layer 23 in the same manner as described above with reference to FIG. 8C.

Figure 9D:
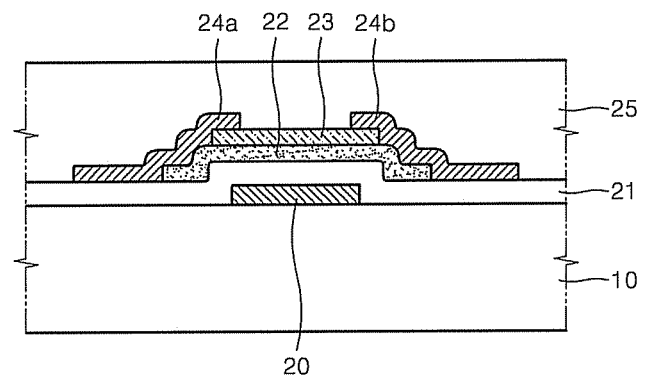

Referring to FIG. 9D, a passivation layer 25 covering the protective layer 23, the source electrode 24a, and the drain electrode 24b is formed on the gate insulating layer 21. The passivation layer 25 may be formed of SiN or $SiO_2$ using either PECVD or PVD methods.

Figure 9E:
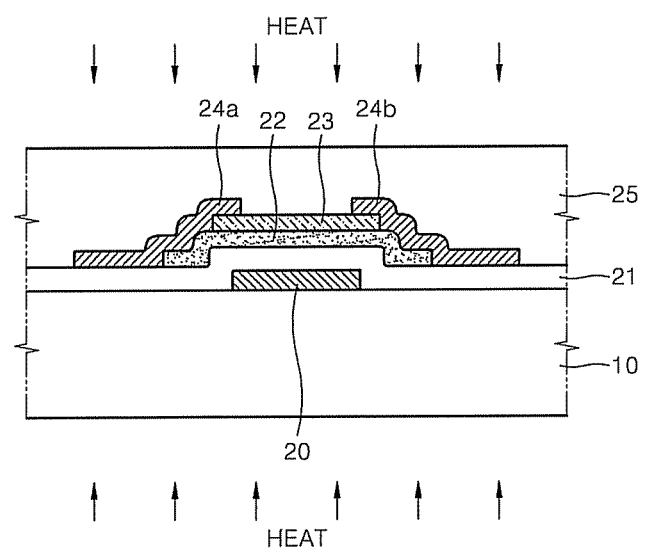

Referring to FIG. 9E, the channel layer 22 and the passivation layer 25 are subjected to annealing, as described previously. Carrier concentration in the channel layer 22 is reduced due to the annealing, thereby obtaining a TFT having the desired electrical properties and the desired threshold voltage.

Accordingly, since oxygen is supplied to the channel layer 22 during the annealing, thereby reducing both the carrier concentration and the shift in the threshold voltage, oxidation is subsequently induced on the surface of the channel layer 22. Reduction can therefore be suppressed during the annealing by including a sufficient amount of incomplete oxygen in either the passivation layer 25 or the protective layer 23 contacting the channel layer 22.

The carrier concentration provided by the oxygen supply can be adjusted by controlling the process conditions in the formation of the passivation layer 25 or the protective layer 23 as described above.

In one embodiment, a TFT comprising ZnO, specifically, a TFT comprising GIZO, is provided having a desired threshold voltage obtained by controlling the carrier concentration. The ZnO-based TFT can be applied to an article requiring a large switching device such as a liquid crystal display (LCD), an organic light-emitting diode (OLED) display, and the like. The ZnO-based TFT can also be applied to a memory device or a logic device, such as, for example, a cellular phone, a mobile device, a notebook computer, a monitor, or a TV, that employ an LCD or an OLED.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a thin film transistor (TFT), the method comprising:
    forming a channel layer comprising ZnO on a substrate;
    forming an oxide layer containing unbonded free oxygen or incompletely bonded oxygen on the channel layer by using low temperature plasma enhanced chemical vapor deposition (LT-PECVD) performed at a temperature of about room temperature to about 250° C., the oxide layer being formed of an oxygen-rich oxide of which the oxygen content is greater than an oxygen content of the same oxide which is not oxygen-rich, wherein the oxide layer directly contacts the ZnO of the channel layer; and
    annealing the channel layer and the oxide layer,
    wherein the annealing of the channel layer and the oxide layer allows the oxygen of the oxide layer to be introduced to the channel layer, thereby inducing an interfacial reaction between the channel layer and the oxide layer and reducing carrier concentration in the channel layer, and
    wherein the LT-PECVD is performed at a pressure equal to or greater than about 2.5 Torr and a $N_2O$ flow rate equal to or greater than about 1375 sccm.

2. The method of claim 1, wherein the channel layer is formed of gallium-indium-zinc-oxide (GIZO).

3. The method of claim 1, wherein the oxide layer is a silicon oxide ($SiO_x$) layer formed by LT-PECVD, wherein the LT-PECVD comprises a $N_2O$ source gas.

4. The method of claim 1, wherein the LT-PECVD is performed at a temperature of about 150° C.

5. The method of claim 1, wherein the LT-PECVD is performed at a radio frequency (RF) power of about 0.1 to about 4 $W/cm^2$, a pressure of about 1.0 to about 4.0 Torr, and a $N_2O$ flow rate of about 1000 to about 7000 sccm.

6. The method of claim 5, wherein the LT-PECVD is performed at an RF power of about 0.9 $W/cm^2$, a pressure of about 3.5 Torr, and a $N_2O$ flow rate of about 2500 sccm.

7. The method of claim 6, wherein the LT-PECVD is performed at a temperature of about 150°.

8. The method of claim 1, wherein the annealing is performed at a temperature of about 200° C.

9. A method of manufacturing a TFT, the method comprising:
    forming a channel layer comprising ZnO on a substrate;
    forming a conductive material layer on the channel layer;

patterning the conductive material layer to form a source electrode and a drain electrode contacting both sides of the channel layer;

forming an oxide passivation layer comprising unbonded free oxygen or incompletely bonded oxygen on the channel layer, the source electrode, and the drain electrode by using low temperature plasma enhanced chemical vapor deposition (LT-PECVD) performed at a temperature of about room temperature to about 250° C., the oxide passivation layer being formed of an oxygen-rich oxide of which the oxygen content is greater than an oxygen content of the same oxide which is not oxygen-rich, wherein the oxide passivation layer directly contacts the ZnO of the channel layer; and annealing the channel layer and the passivation layer to introduce the oxygen of the passivation layer to the channel layer, thereby inducing an interfacial reaction between the channel layer and the passivation layer, and reducing carrier concentration in the channel layer, and wherein the LT-PECVD is performed at a pressure equal to or greater than about 2.5 Torr and a $N_2O$ flow rate equal to or greater than about 1375 sccm.

10. The method of claim 9, wherein the channel layer is formed of GIZO.

11. The method of claim 9, wherein the passivation layer is a SiOx layer formed by LT-PECVD wherein the LT-PECVD comprises a $N_2O$ source gas.

12. The method of claim 9, wherein the LT-PECVD is performed at a temperature of about 150° C.

13. The method of claim 9, wherein the LT-PECVD is performed at an RF power of about 0.1 to about 4 W/cm$^2$, a pressure of about 1.0 to about 4.0 Torr, and a $N_2O$ flow rate of about 1000 to about 7000 sccm.

14. The method of claim 13, wherein the LT-PECVD is performed at an RF power of about 0.9 W/cm$^2$, a pressure of about 3.5 Torr, and a $N_2O$ flow rate of about 2500 sccm.

15. The method of claim 14, wherein the LT-PECVD is performed at a temperature of about 150° C.

16. The method of claim 9, wherein the annealing is performed at a temperature of about 200° C.

17. A method of manufacturing a TFT, the method comprising:

forming a channel layer comprising ZnO on a substrate;

forming an oxide material layer comprising unbonded free oxygen or incompletely bonded oxygen on the channel layer by using low temperature plasma enhanced chemical vapor deposition (LT-PECVD) performed at a temperature of about room temperature to about 250° C., the oxide material layer being formed of an oxygen-rich oxide of which the oxygen content is greater than an oxygen content of the same oxide which is not oxygen-rich, wherein the oxide material layer directly contacts the ZnO of the channel layer;

patterning the oxide material layer to form an etch stop layer covering a middle portion of the channel layer and exposing both sides of the channel layer;

forming a conductive material layer on the channel layer and the etch stop layer and patterning the conductive material layer to form a source electrode and a drain electrode contacting both the sides of the channel layer;

forming a passivation layer covering the source electrode, the drain electrode, and a portion of the etch stop layer between the source electrode and the drain electrode; and annealing the channel layer and the oxide material layer to introduce the oxygen of the etch stop layer to the channel layer, thereby inducing an interfacial reaction between the channel layer and the etch stop layer, and reducing carrier concentration in the channel layer, and wherein the LT-PECVD is performed at a pressure equal to or greater than about 2.5 Torr and a $N_2O$ flow rate equal to or greater than about 1375 sccm.

18. The method of claim 17, wherein the channel layer is formed of GIZO.

19. The method of claim 17, wherein the etch stop layer is a SiOx layer formed by LT-PECVD, wherein the LT-PECVD comprises a $N_2O$ source gas.

20. The method of claim 17, wherein the LT-PECVD is performed at a temperature of about 150° C.

21. The method of claim 17, wherein the LT-PECVD is performed at an RF power of about 0.1 to about 4 W/cm$^2$, a pressure of about 1.0 to about 4.0 Torr, and a $N_2O$ flow rate of about 1000 to about 7000 sccm.

22. The method of claim 21, wherein the LT-PECVD is performed at an RF power of about 0.9 W/cm$^2$, a pressure of about 3.5 Torr, and a $N_2O$ flow rate of about 2500 sccm.

23. The method of claim 22, wherein the LT-PECVD is performed at a temperature of about 150° C.

24. The method of claim 17, wherein the annealing is performed at a temperature of about 200° C.

* * * * *